United States Patent
Wen et al.

(10) Patent No.: US 9,628,106 B1
(45) Date of Patent: Apr. 18, 2017

(54) ANALOG TO DIGITAL CONVERTERS WITH OVERSAMPLING

(71) Applicant: Avnera Corporation, Beaverton, OR (US)

(72) Inventors: Jianping Wen, Beaverton, OR (US); Ali Hadiashar, Portland, OR (US); Eric King, San Jose, CA (US); David Entrikin, Portland, OR (US); Wai Lang Lee, Austin, TX (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/007,054

(22) Filed: Jan. 26, 2016

Related U.S. Application Data

(63) Continuation of application No. 14/605,952, filed on Jan. 26, 2015, now abandoned.

(60) Provisional application No. 61/931,525, filed on Jan. 24, 2014.

(51) Int. Cl.
*H03M 3/00* (2006.01)

(52) U.S. Cl.
CPC ............. *H03M 3/496* (2013.01); *H03M 3/32* (2013.01)

(58) Field of Classification Search
CPC ......... H03M 3/454; H03M 3/43; H03M 3/452
See application file for complete search history.

(56) References Cited

U.S. PATENT DOCUMENTS

| | | | |
|---|---|---|---|
| 5,055,843 A * | 10/1991 | Ferguson, Jr. | H03G 3/02 341/143 |
| 6,400,297 B1 * | 6/2002 | Tucker | H03M 3/32 341/143 |
| 6,489,907 B2 * | 12/2002 | Cusinato | H03M 3/364 341/143 |
| 2005/0200586 A1 * | 9/2005 | Kojima | G09G 3/3696 345/96 |

* cited by examiner

*Primary Examiner* — Peguy Jean Pierre
(74) *Attorney, Agent, or Firm* — Marger Johnson

(57) ABSTRACT

Embodiments of the invention include an oversampling Analog to Digital Converter that uses uneven non-overlapping clock phases to reduce switched capacitor circuit power consumption. A return-to-zero sub phase of one of the clock phases may also be used for feedback reference capacitors. A delay lock loop may be combined with the non-overlapping clock phase generator to control accurate timing.

2 Claims, 11 Drawing Sheets

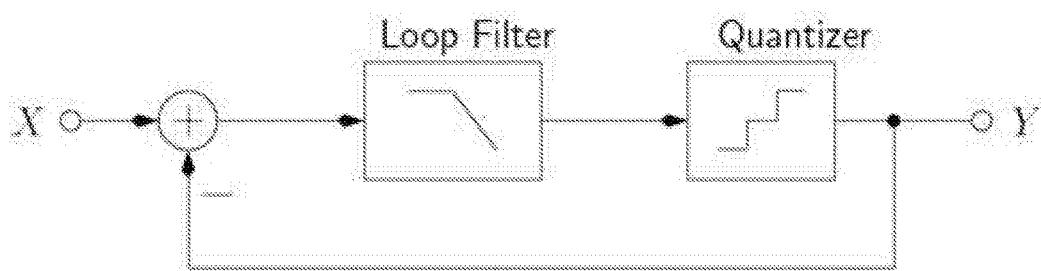
FIG. 1
(Conventional)

ANALOG TO DIGITAL CONVERTERS WITH OVERSAMPLING

CROSS REFERENCE TO RELATED APPLICATIONS

This application claims priority to and is a continuation of co-pending U.S. Non-Provisional application Ser. No. 14/605,952, entitled ANALOG TO DIGITAL CONVERTERS WITH OVERSAMPLING, filed Jan. 26, 2015, which in turn claims benefit from U.S. Provisional application 61/931,525, entitled ANALOG TO DIGITAL CONVERTERS WITH OVERSAMPLING, filed on Jan. 24, 2014, the contents of both of which are incorporated by reference herein.

FIELD OF THE INVENTION

This disclosure is directed to Analog-to-Digital Converters (ADCs) and, more specifically, to ADCs that consume relatively low amounts of electrical power.

BACKGROUND

Low power circuit design is one of the most active IC design arenas in modern electronics, at least in part because of the constant pressure to increase battery life in mobile devices. As oversampling analog to digital converters ($\Delta\Sigma$ ADCs) have wide applications in modern electronics, reducing their power consumptions while maintaining performance has significant implications in new product development.

Unlike Nyquist rate ADCs, where analog signal is digitized by a set of quantized reference levels of which the number of quantization levels directly determines the resolution of an ADC, oversampling ADCs use only a small number of quantization levels to achieve high conversion resolution. For example, a $\Delta\Sigma$ ADC with a 1-bit quantizer can achieve conversion resolutions of more than 12-bit. The large amount of quantization noise in a $\Delta\Sigma$ ADC is pushed outside the signal band by a loop filter and only a small amount of in-band quantization noise remains. The subsequent digital filter can remove the out-of-band quantization noise to achieve high resolution. In other words, the analog difficulties of designing high precision reference levels are traded with digital signal processing, which is much easier to implement. The architecture of a typical low pass loop filter $\Delta\Sigma$ ADC is shown in FIG. 1.

BRIEF DESCRIPTION OF THE DRAWINGS

FIG. 1 is a functional block diagram of a conventional ADC.

DETAILED DESCRIPTION

An optimize quantization noise transfer function (NTF) may be used to minimize $\Delta\Sigma$ ADC power consumption.

The resolution of an Analog to Digital Converter (ADC) is measured by its Signal to Noise Ratio (SNR). Given the maximum signal level that an ADC can handle without excessive distortion, a lower noise level leads to higher SNR. Like any other type of ADCs, noise of a $\Delta\Sigma$ ADC has two components: quantization noise and circuit noise. While circuit noise can be reduced by using more power and occupying larger chip area, signal band quantization noise can be reduced by a proper quantization noise transfer function (NTF), which is determined by the loop filter shown in FIG. 1. It is desirable to have an NTF that can reduce in-band quantization noise to a much lower level, so that the total in-band ADC noise is dominated by circuit noise only.

Reducing in-band quantization noise will increase out-of-band quantization noise, since a total quantization noise power is constant. The maximum value of the NTF is defined as noise gain, which is a measure of out-of-band quantization noise. Empirical study shows that noise gain has a direct impact on loop stability: the larger the noise gain, the smaller the maximum signal level a $\Delta\Sigma$ ADC can handle before it becomes unstable or overloaded. This is where the design art comes in: on one hand it is desirable to diminish in-band quantization noise and therefore maximize noise margin for the circuit to reduce power; on the other hand it is undesirable to have too much NTF noise gain, otherwise the maximum signal level has to be reduced for loop stability, which in turn will demand more power to reduce circuit noise to achieve the target SNR. The art is to find the optimized NTF for minimum power consumption. The following optimization data is disclosed from an actual 100 dB audio band ADC development.

Figure 2:
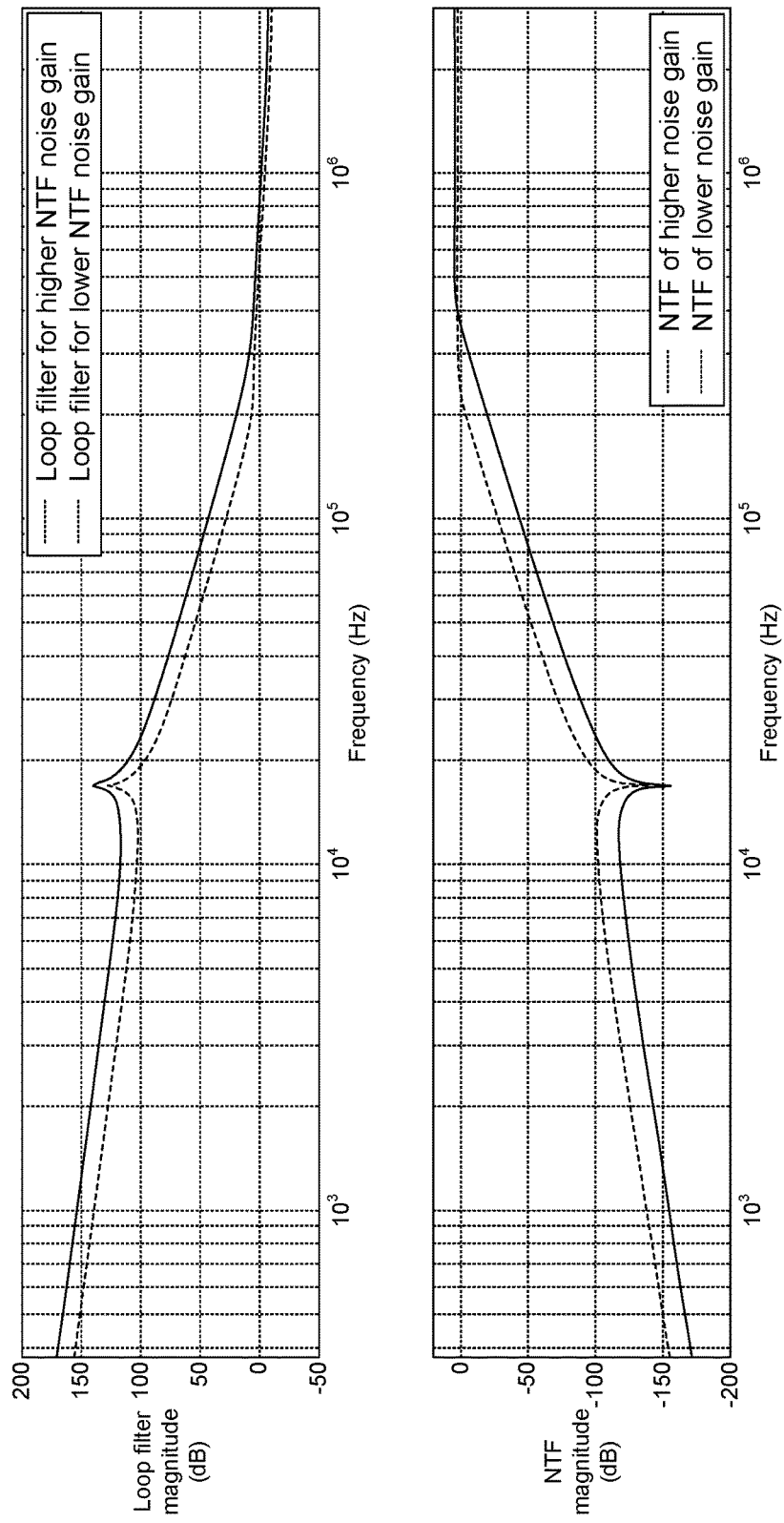
FIG. 2 is a graph of frequency responses of two known loop filters (top panel) and their corresponding noise transfer functions (NTFs, bottom panel).

FIG. 2 shows the frequency responses of two loop filters (top panel) and their corresponding noise transfer functions (NTFs, bottom panel). The solid curves lead to lower in-band quantization noise but higher NTF noise gain (1.7), and the dashed curves result in higher in-band quantization noise but lower NTF noise gain (1.4).

In the development of a 100 dB audio band (20-20 kHz) $\Delta\Sigma$ ADC with sample rate of 6 MHz and internal 1.5-bit quantizer, the above two NTFs are compared in terms of power consumption. The NTF1 with noise gain of 1.72 (solid curve) gives −149 dBFS (decibels relative to full scale) audio band quantization noise, and the NTF2 with noise gain of 1.40 (dashed curve) gives −125 dBFS audio band quantization noise. For a SNR=100 dB, a −115 dBFS quantization noise only degrades SNR by 0.1 dB, therefore both NTF1 and NTF2 have little impact on total ADC noise floor. However, because NTF1 has larger noise gain than NTF2 does, a maximum signal level of an ADC with NTF1 will be 20% lower than that of an ADC with NTF2 (K. C. H. Chao, S. Nadeem, W. L. Lee and C. G. Sodini, "A Higher Order Topology for Interpolative Modulators for Oversampling A/D Converters", IEEE Trans. Circuits and Sys., vol. CAS-37, pp. 309-318, March 1990). To achieve the same SNR of 100 dB, the circuit noise of an ADC with NTF1 needs to be 20% lower than that of ADC with NTF2. Since reduction of noise by 20% increases power by 44%, a loop filter with NTF2 was used in silicon. Lab measurement showed that both SNR and power consumption match design targets.

Note that further reduction of noise gain from NTF2 is not suggested, because a design margin should be left for in-band quantization noise for process variations. In this design example, a 10 dB design margin is used since NTF2 has −125 dBFS in-band quantization, while −115 dBFS in-band quantization noise will degrade an ADC SNR by 1 dB. In other words, an optimized NTF in this type of $\Delta\Sigma$ ADC has noise gain of 1.4.

In summary, to realize a low power $\Delta\Sigma$ ADC design, the first step is to optimize its loop filter for optimized NTF. An optimized loop filter should be one that maximizes signal swing while keeping the in-band quantization noise barely below the significant level at which it starts to have impact on total noise.

In practical design, however, it is not trivial to design a loop filter that is faithful to its optimized target over all process, supply voltage, and temperature variations. As a common practice, in-band quantization noise is often suppressed excessively to ensure that it is always below the significant level, which ends up with a non-optimized loop filter that has power consumption higher than it otherwise could be.

A technique disclosed below addresses one common design issue that degrades loop filter accuracy.

A de-coupling technique is used to reduce coupling among integrator stages through a passive summer.

Figure 3:
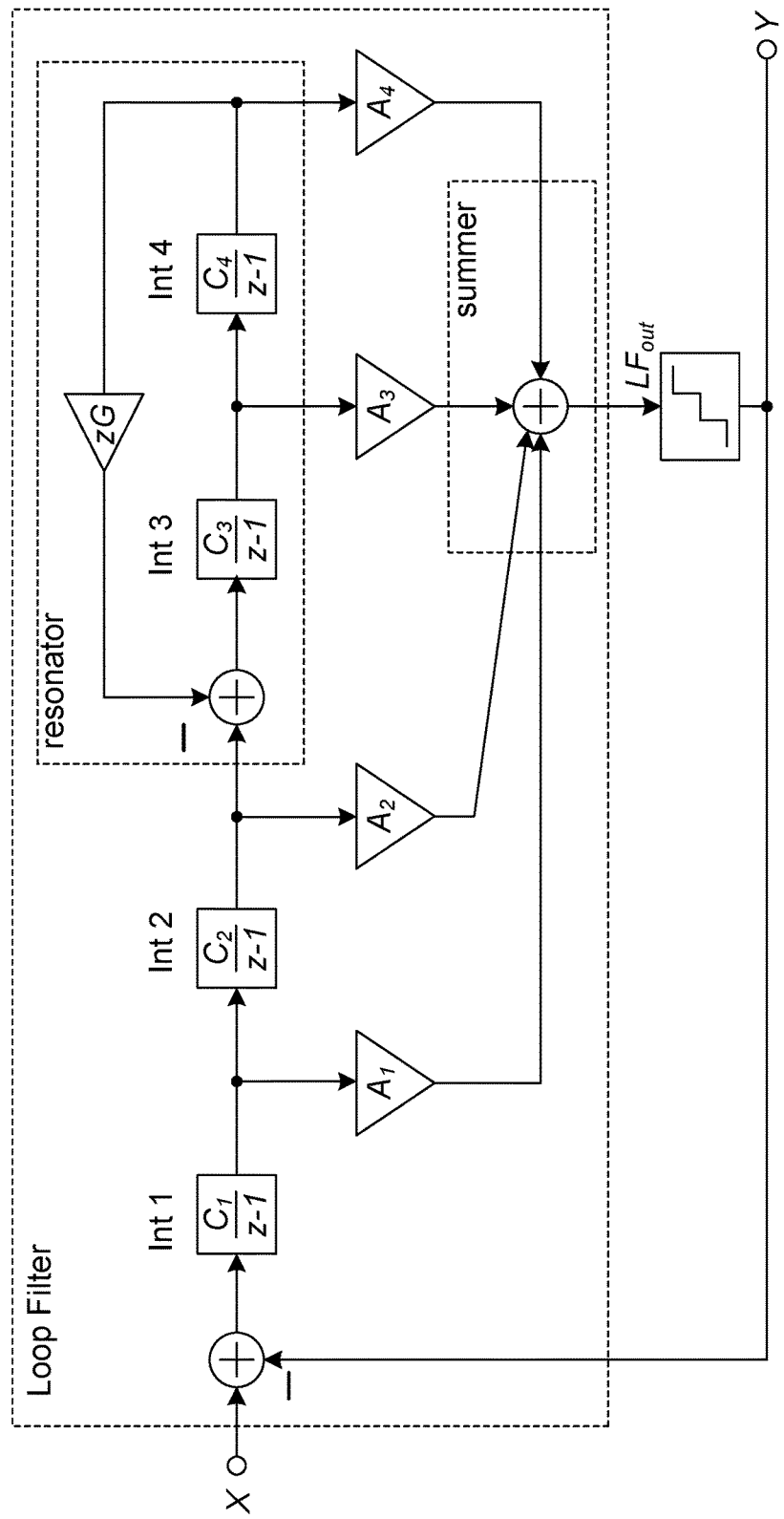
FIG. 3 is a functional block diagram of a conventional ADC modulator including a loop filter.

FIG. 3 is a block diagram that shows the architecture of a 4th order $\Delta\Sigma$ ADC used to develop the 100 dB audio band $\Delta\Sigma$ ADC mentioned above. Its loop filter includes of 4 integrators and a summer. The last 2 integrators form a resonator through a local feedback path. Global feedback of ADC output Y is outside a loop filter, as illustrated in FIG. 1, however, for convenience of circuit implementation, the network that performs subtraction between input X and feedback Y is normally included within the loop filter, as FIG. 3 illustrates.

In low power design, a summer is commonly implemented as a passive network instead of an active component. A conventional switched capacitor implementation of the loop filter of FIG. 3 is illustrated in FIG. 4.

Figure 4:
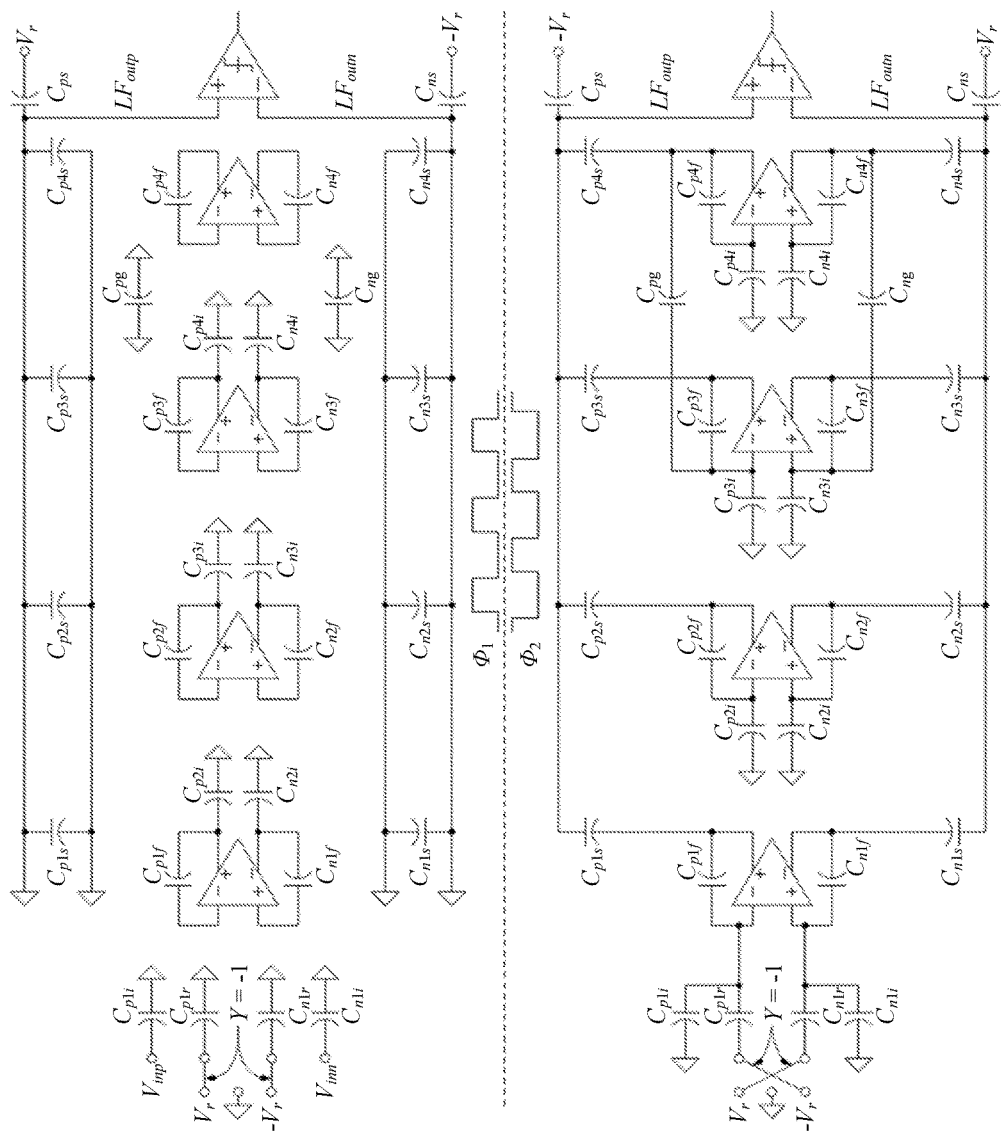
FIG. 4 is a circuit diagram of a conventional switched capacitor implementation of the loop filter of FIG. 3.

FIG. 4 is a conventional switched capacitor implementation of the loop filter architecture illustrated in FIG. 3.

The loop filter of FIG. 4 is driven by 2 non-overlapping clock phases: charging phase ($\Phi$1, top panel) and dumping phase ($\Phi$2, bottom panel). In the charging phase $\Phi$1, an input capacitor of each integrator is charged by the output of its preceding stage. The input capacitor of integrator 1 is charged by the input signal of ADC. At the same time, feedback reference capacitors (Cp1r and Cn1r) are charged to the corresponding reference voltages, according to ADC output Y (Y=−1 as an example in FIG. 4) of previous cycle. The passive summer in FIG. 4 is created by coefficient capacitors Cp1s-Cp4s and Cn1s-Cn4s, and summer reference capacitors Cps and Cns.

During charging phase $\Phi$1, all of the coefficient capacitors are discharged to 0 and the summer reference capacitors are pre-charged to the reference voltage. The summer output (LFout) is also discharged to 0. All of the integrator stages are in hold state and isolated from each other. In dumping phase $\Phi$2, a charge on input capacitor of each stage is dumped into an integrating capacitor of the corresponding stage. At the same time, integrator outputs of all the stages are summed together through the capacitor network.

After a transient is settled near the end of dumping phase $\Phi$2, a quantizer makes a decision and a new ADC sample is latched for the next cycle. Note that there are two complementary comparator configurations in a 1.5-bit quantizer. In order to draw a legible illustration, one configuration is omitted in FIG. 4.

If the amplifiers of integrators are ideal, with infinite gain and bandwidth, at the end of dumping phase $\Phi$2, the current state of each integrator should only depend on its previous state, and new charges dumped from its input capacitor in the current cycle. In other words, the ideal state of each integrator (except integrator 3 and 4 that form a resonator through a local positive feedback path) should not depend on the states of other integrators at the current cycle. In reality, especially in low power design, however, amplifiers always have finite gain and bandwidth, and the coupling among all integrators through the passive summer network during dumping phase $\Phi$2 makes the settling dynamics of each stage interfere with each other. As a result, a final voltage of each integrator will deviate from its ideal value.

Figure 5:
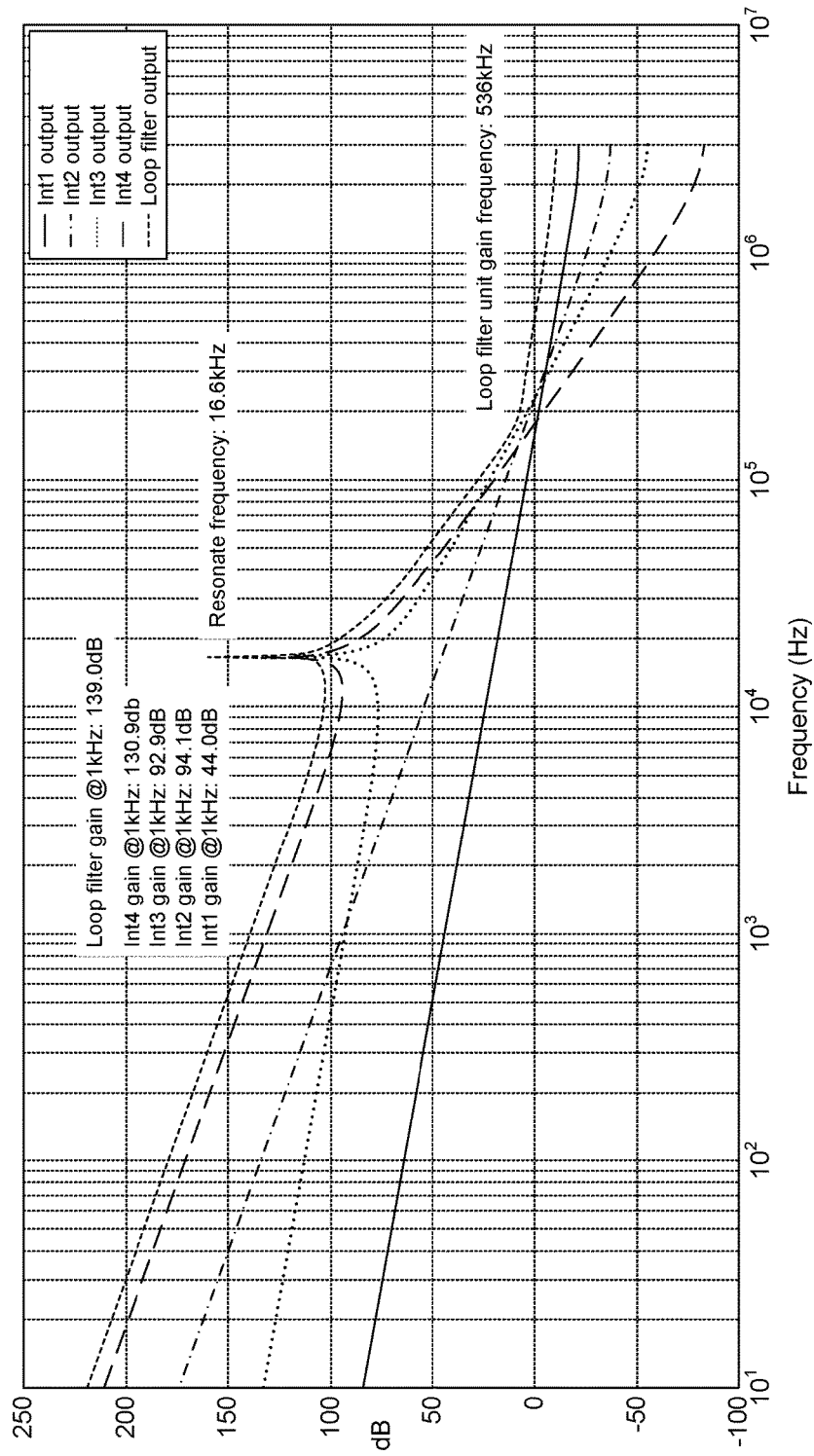
FIG. 5 is graph of an ideal loop filter frequency response of a 4th order 1.5-bit ADC.
Figure 6:
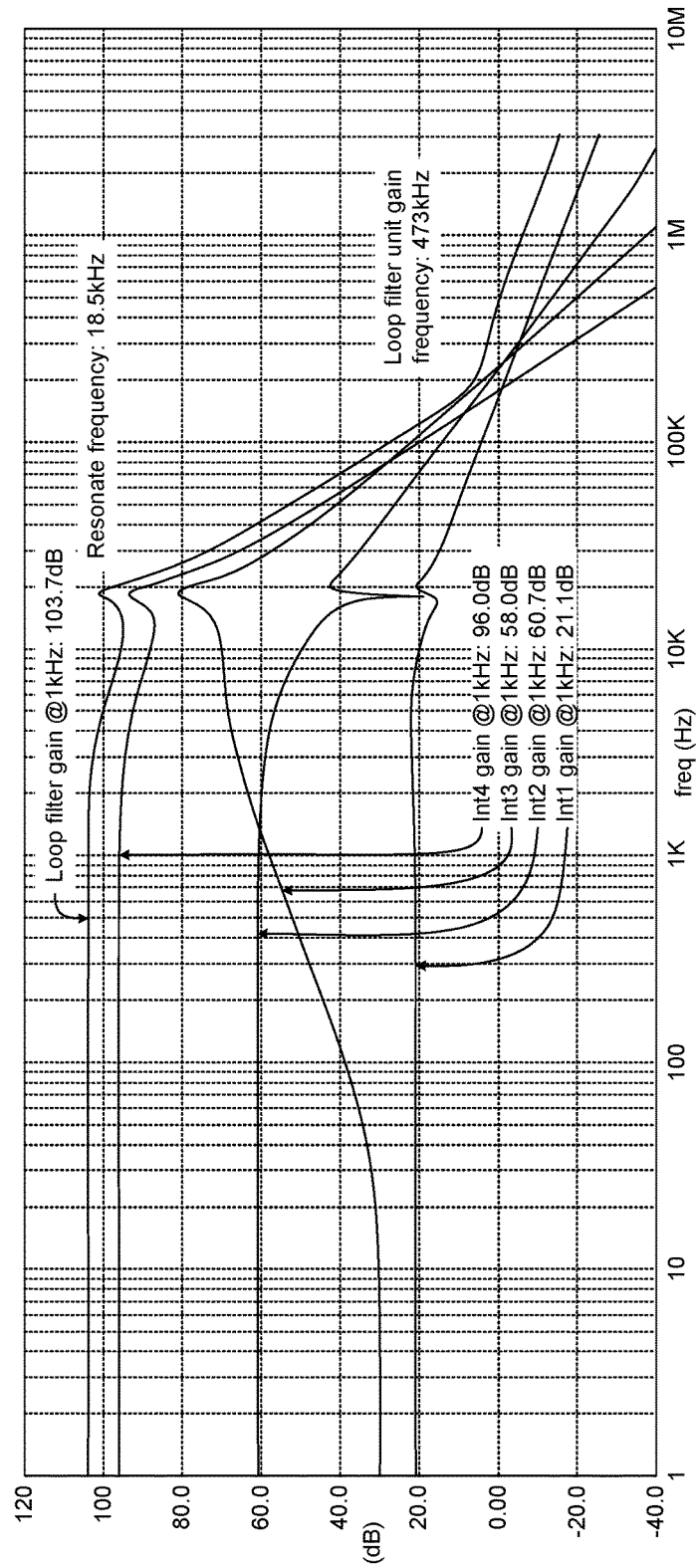
FIG. 6 is a graph of a degraded frequency response of the loop filter having a conventional passive summer.

FIG. 5 illustrates an ideal loop filter frequency response of a 4th order 1.5 bit $\Delta\Sigma$ ADC, while FIG. 6 illustrates degraded frequency response of the loop filter with a conventional passive summer.

FIG. 5 shows the target frequency response of an optimized loop filter in terms of power consumption. If it is implemented with a conventional passive summer as illustrated in FIG. 4, the frequency response is largely deviated from its target as shown in FIG. 6. (1) no stage behaves as an integrator below 10 kHz; (2) gains are severely reduced for all stages below resonate frequency; (3) gains of integrator 1 and integrator 2 are perturbed by resonator at resonating frequency; (4) unit gain frequency of loop filter output is reduced from target 550 kHz to about 473 kHz. Such a degradation will increase in-band quantization noise substantially, e.g., 35 dB at 1 kHz and 22 dB in audio band. The optimized NTF2 mentioned above that gives audio band quantization noise of −125 dBFS, if implemented with conventional passive summer as shown in FIG. 4, will end up with −103 dBFS audio band quantization noise, which is only 3 dB lower than the specified total noise of −100 dBFS. In order to achieve resolution of SNR-100 dB, circuit noise needs to be below −103 dBFS, or power consumption has to be doubled. Therefore, a non-optimized NTF, such as NTF1 mentioned above, needs to be used to compensate for this loop filter degradation. But, it also increases power consumption for the other reason as explained above.

A de-coupling technique is disclosed below that can improve the loop filter accuracy significantly. Since integrator 3 and 4 are coupled to each other by a resonator loop any way, the decoupling technique focuses on isolating integrator 1 and integrator 2 only. The additional coupling between integrator 3 and 4 through the passive summer will alter overall loop filter response slightly, however, due to large gains from integrator 1 and 2, the input referred error will be negligible.

Figure 7:
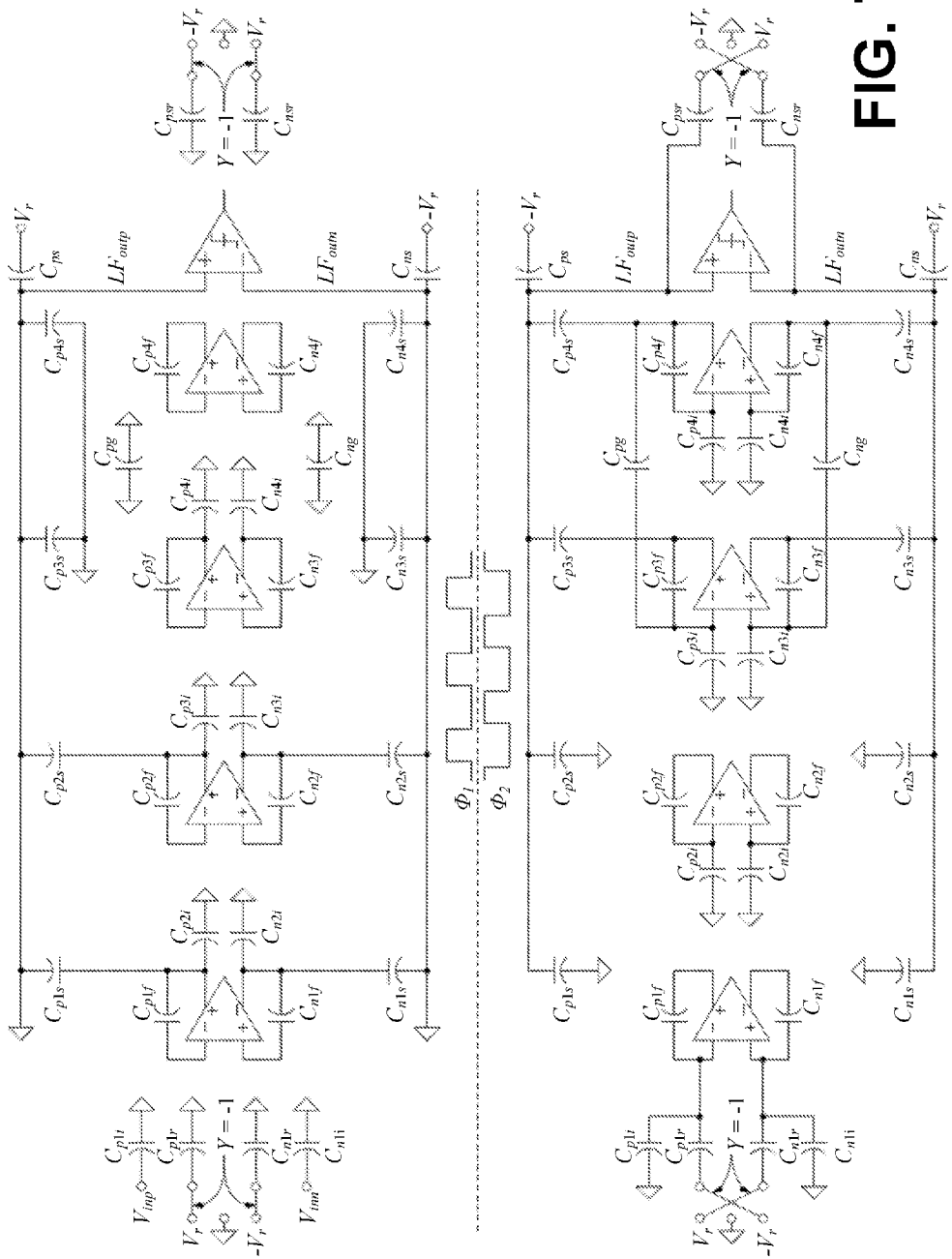
FIG. 7 is a circuit diagram of a loop filter circuit including a de-coupling technique according to embodiments of the invention.

FIG. 7 is a circuit diagram of a switched capacitor implementation according to embodiments of the invention. One of the differences between the circuit illustrated in FIG. 7 and the one illustrated in FIG. 4 is that, in charging phase $\Phi$1, coefficient capacitors of integrator 1 and integrator 2 are charged by integrator outputs instead of discharged to 0.

Note that integrator 1 and integrator 2 are decoupled from each other in this phase because of the low impedance of analog ground. In dumping phase Φ2, coefficient capacitors of integrator 1 and integrator 2 carry the charge to the passive summer while integrator 1 and integrator 2 are de-coupled from the transient of other stages. Note also that, because the charges on coefficient capacitors of integrator 1 and integrator 2 do not include feedback of ADC output Y of previous cycle, a feedback reference network is implemented inside the passive summer by capacitors Cpsr and Cnsr as shown at the right side of FIG. 7. With proper sizes of coefficient capacitors, the circuit of FIG. 7 can be mathematically identical to the circuit of FIG. 4, but the implementation accuracy will be much higher, as shown in FIG. 8.

Figure 8:
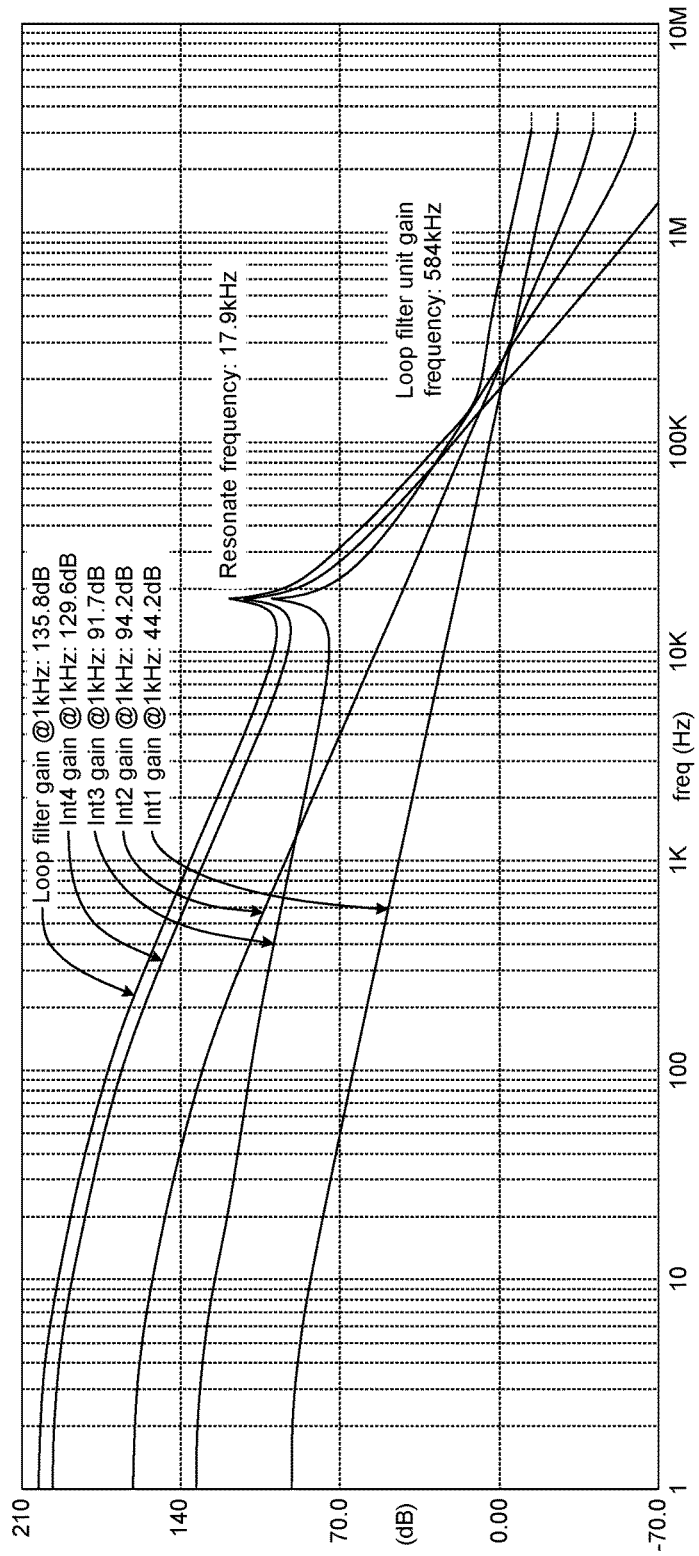
FIG. 8 is a graph illustrating a frequency response of the optimized loop filter of FIG. 7.

FIG. 8 illustrates a frequency response of the loop filter that uses the decoupling technique shown in FIG. 7 and according to embodiments of the invention.

Compared to that of FIG. 6, the frequency response of the loop filter of FIG. 7 is much closer to its mathematical target shown by FIG. 5. The gain reduction at frequencies below 100 Hz is due to finite gain of amplifiers, which will have only negligible impact on quantization noise shaping.

The de-coupling technique described above leads to an accurate circuit implementation of a loop filter. Because design margin can be reduced substantially, power consumption is also be minimized with an optimized loop filter.

In conventional switched capacitor circuit design, charging phase Φ1 and dumping phase Φ2 have equal duration, as illustrated in FIGS. 4 and 7. Careful study of the circuit configuration reveals that power consumption can be further reduced by using uneven, non-overlapping clock phases.

In charging phase 1, all amplifiers are in holding state, therefore they are much quieter compared to their dynamics during dumping phase Φ2, where new charges are being integrated. This is especially true for integrator 1, due to a large step size of the quantized feedback signal. As is common in switched capacitor circuit design, more than half of the power is consumed by the amplifier of integrator 1 to increase its bandwidth and slew rate in order to settle with high accuracy during dumping phase Φ2.

Based on above observation, the amplifier bandwidth and slew rate can be reduced by increasing the dumping phase Φ2 duration. To keep the same sample rate, a duration of the charging phase Φ1 is reduced accordingly. If ¾ of a cycle is allocated to dumping phase Φ2, and ¼ allocated to charging phase Φ1, as shown in FIG. 9, the power consumptions of all integrators can be reduced by ⅓, as long as settling accuracy of charging phase Φ1 is not compromised, which is usually the case because the loadings of amplifiers in charging phase Φ1 are much lighter compared to that in dumping phase Φ2.

Figure 9:
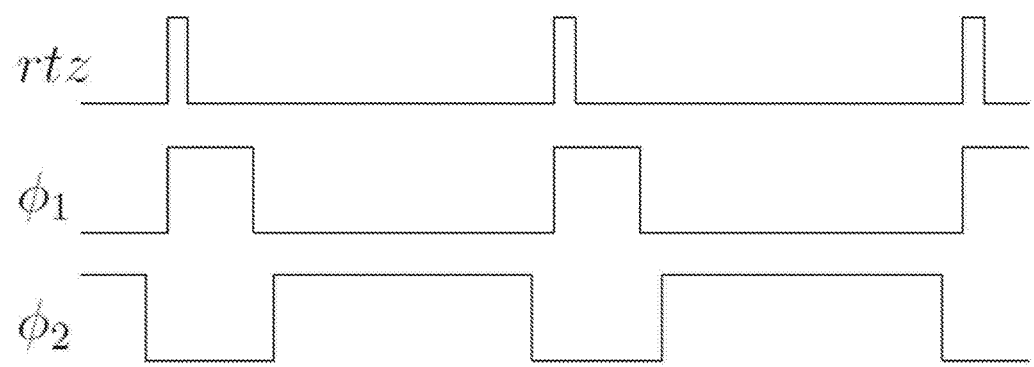
FIG. 9 is a timing chart illustrating uneven non-overlapping clock phases used in embodiments of the invention.
Figure 10:
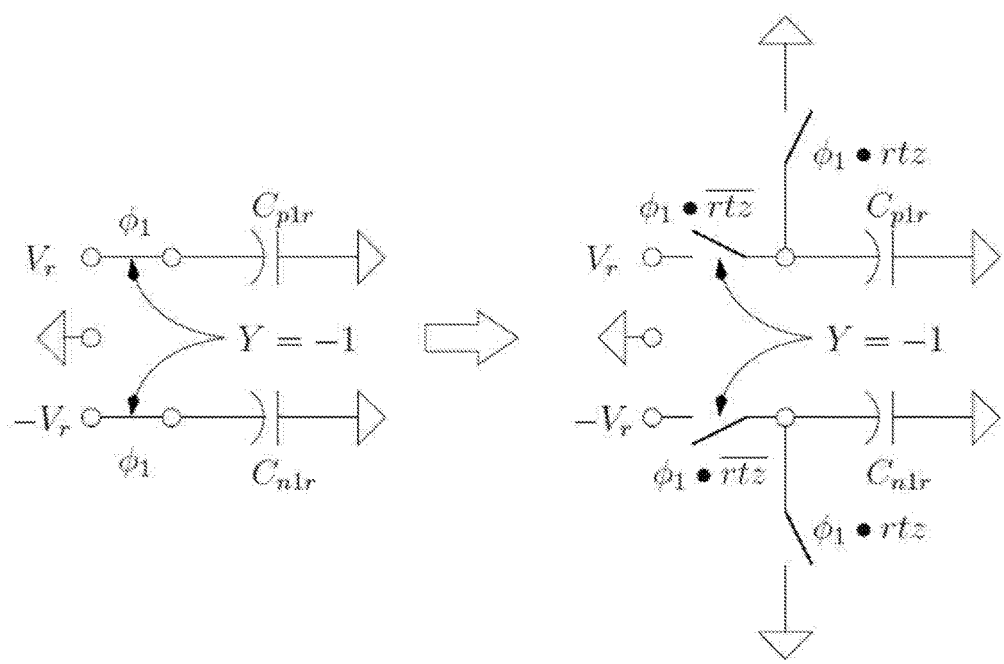
FIG. 10 is an example circuit diagram that may be used to implement a return-to-zero function according to embodiments of the invention.

FIG. 9 illustrates uneven non-overlapping clock phases to reduce switched capacitor circuit power consumption. Reduction of charging phase Φ1 requires careful timing control. The feedback reference capacitors Cp1r and Cn1r in FIG. 7 are charged in phase Φ1 of current cycle to a new reference voltage corresponding to ADC output Y at the previous cycle. To reduce inter-symbol-interference (ISI) that causes distortion, these two capacitors are always discharged to 0 before they are charged to the new reference voltage. In other words, there is a return-to-zero sub phase inside charging phase Φ1 for feedback reference capacitors, which is illustrated in FIG. 9 as rtz, and the circuit implementation is illustrated in FIG. 10. The actual charging time of the feedback reference capacitors will be the remaining duration of charging phase Φ1 after the return-to-zero sub phase ends.

The return-to-zero sub phase should not be too short, otherwise the ISI elimination is insufficient. The rtz sub phase also should not be too long, otherwise the feedback reference capacitors cannot accurately settle to the new reference voltage before phase Φ1 ends. Settling accuracy is exponentially degraded with settling time reduction. For example, a −100 dB settling accuracy requires at least 11.5τ, where τ is the settling time constant. If total duration of Φ1 is 40 ns, and 10 ns is allocated to return-to-zero phase, then only 30 ns is left for feedback reference capacitors to settle, which requires a settling time constant τ=2.6 ns. If the timing of the return-to-zero phase is not carefully controlled, IC fabrication process variations and circuit temperature drift can easily change the return-to-zero phase by 2.6 ns simply through rising/falling edge and propagation delay variations, and the feedback reference cap settling time can be reduced from 11.5τ to 10.5τ. As a result, in such a case, the settling accuracy is reduced from −100 dB to −91 dB.

Figure 11:
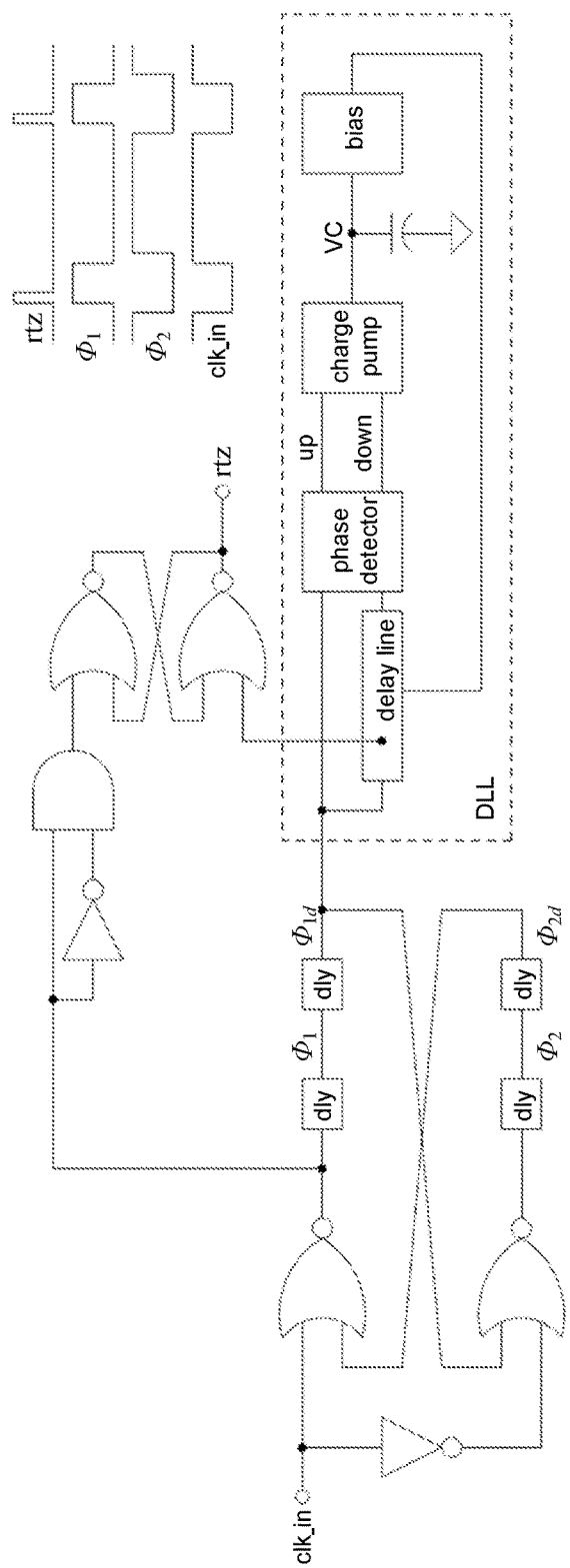
FIG. 11 is an example circuit diagram of a delay lock loop that may be used in embodiments of the invention to accurately control timing.

To accurately control the timing of return-to-zero phase, a delay lock loop (DLL) can be combined with the non-overlapping clock phase generator, as shown in FIG. 11.

In the example illustrated in FIG. 11, a delay line inside the DLL delays its input Φ1 pulse rising/falling edges by the entire duration of phase Φ1, regardless of fabrication process, supply voltage and circuit temperature variations. A reset signal of rtz is tapped off at the ¼ of the delay line. With such a design, rtz phase accurately starts at the beginning of phase Φ1, and ends at ¼ duration of phase Φ1.

The power consumption of the DLL illustrated in FIG. 11 can be less than 15 μA. Compared to current savings from integrator amplifiers by introducing uneven non-overlapping clock phases, this overhead is negligible.

Embodiments of the invention include circuit elements to realize an oversampling analog-to-digital converter with minimum power consumption. More specifically, the audio ADC described above has better performance and lower power than any ADC available previously. The optimization method by selecting proper noise transfer function to minimize power consumption is general to all oversampling analog to digital converters. Although the de-coupling technique is illustrated by a switched capacitor implementation of the loop filter, it can be applied to other implementations using a passive summer. The uneven non-overlap clock phase technique is unique to switched capacitor implementation, however, as a general power saving technique, it can also be applied to other switched capacitor circuits beyond oversampling analog to digital converters, such as switched capacitor filters, switched capacitor amplifiers, etc. Among the benefits are: (1) Optimization of noise transfer function for power efficiency; and (2) de-coupling technique that ensures accurate loop filter frequency response therefore reduce design margin, which makes the optimization in (1) particularly meaningful.

Although specific embodiments of the invention have been illustrated and described for purposes if illustration, it will be understood that various modifications may be made without departing from the spirit and scope of the invention.

What is claimed is:
1. An analog-to-digital modulator, comprising:
 a switched-capacitor loop filter, including:
  first, second, third and fourth integrators operable in a charging phase and a dumping phase, in which the first and second integrators are decoupled from the remaining third and fourth integrators during the dumping phase.

2. The analog-to-digital modulator according to claim 1, in which the charging phase is driven by a first clock and the dumping phase is driven by a second clock, and in which the first and second clocks have non-overlapping clock phases.

\* \* \* \* \*